US 6,785,617 B2

(12) United States Patent
Weng

(10) Patent No.: US 6,785,617 B2
(45) Date of Patent: Aug. 31, 2004

(54) METHOD AND APPARATUS FOR WAFER ANALYSIS

(75) Inventor: Hung-Jen Weng, Pan-Chiao (TW)

(73) Assignee: ProMOS Technologies Inc., Hsinchu (TW)

(*) Notice: Subject to any disclaimer, the term of this patent is extended or adjusted under 35 U.S.C. 154(b) by 309 days.

(21) Appl. No.: 09/905,416

(22) Filed: Jul. 13, 2001

(65) Prior Publication Data
US 2003/0014197 A1 Jan. 16, 2003

(51) Int. Cl.[7] .................................................. G01B 5/28
(52) U.S. Cl. ..................... 702/35; 702/81; 714/738; 700/121; 324/500; 365/230.03
(58) Field of Search ................................ 702/35, 81, 180, 702/185; 700/110, 121, 114, 120, 167; 324/751, 500, 765; 365/230.03, 189.05, 196, 222; 257/E21.525; 714/715, 738–739

(56) References Cited

U.S. PATENT DOCUMENTS 6,185,324 B1 * 2/2001 Ishihara et al. ............. 382/149
6,349,240 B2 * 2/2002 Ogawa et al. ............... 702/185

* cited by examiner

Primary Examiner—John Barlow
Assistant Examiner—Hien Vo
(74) Attorney, Agent, or Firm—Birch, Stewart, Kolasch & Birch, LLP

(57) ABSTRACT

The present invention discloses method and apparatus for wafer analysis. First, a plurality of specific distribution maps, which respectively refer to a defect pattern distribution in a pattern group, is defined. Next, a plurality of distribution features is defined so that each specific distribution map correlates to one of the distribution features. Then, each pattern group on the wafer is compared to each specific distribution map in order to relate each pattern group to at least one of the specific distribution maps, and relate each pattern group on the wafer indirectly to at least one of the distribution features while allocating each distribution feature indirectly related to each pattern group with a respective relative value. Finally, the relative values of each distribution feature are totaled on the wafer respectively to obtain total values of the distribution features. With the method and apparatus disclosed in the present invention, it is easier to detect defective patterns on the wafer systematically and effectively.

12 Claims, 5 Drawing Sheets

METHOD AND APPARATUS FOR WAFER ANALYSIS

BACKGROUND OF THE INVENTION

1. Field of the Invention

The present invention relates to a method and apparatus for wafer analysis, and particularly relates to a method and apparatus for analyzing and classifying pattern groups on a wafer according to the distribution of defective patterns.

2. Description of the Related Art

Conventionally, in a semiconductor manufacturing process, a semiconductor wafer is used as a base. Desired components are formed on a single wafer by applying photograph sensitization of photoresistance, metal deposition or evaporation, liquid etching, and other processes.

Generally, patterns are repeatedly formed on a wafer with a plurality of light masks for simplifying the manufacturing process, wherein each pattern is formed independently. A series of etching processes is then achieved, and the wafer is thereafter cut to accomplish a batch of components.

FIG. 1 shows a typical pattern formation on a wafer. On a typical wafer 1, the wafer masks are not repeatedly constructed in the unit of a single pattern mask; instead, the masks are repeatedly formed in the form of masks of pattern groups 3. In a pattern group 3, a plurality of patterns are generally arranged in a matrix, such as the widely used 2×3 matrix as shown in FIG. 1. In the wafer manufacturing process, the light mask forms a pattern group 3 of 2×3 matrix on a predetermined position with one shot. Thus, with repeated shots, pattern groups 3 are formed on adjacent positions on the wafer.

Occasionally, however, error occur in the above-mentioned manufacturing process, and thus defective patterns may be formed on the wafer. In response to the errors, it is essential to analyze and evaluate the defect distribution on the wafer. If the defective patterns, for example, exist on the right half in nearly most of the pattern groups, it can be interpreted as an error with regularity. In this case, it is possible that errors occurred on the right half of the light mask, or the horizontal alignment of the machine may have been inclined to the right side; other factors that cause regular defective patterns will also be considered. This analysis is the so-called Shot Pattern Recognition (SPR).

Conventional SPR relies on the experience of the operator. That is, no systematic analyzing methods are applied in SPR. In view of this, it is an object of the present invention to disclose a systematic method and apparatus for wafer analysis to address the above-mentioned problem.

SUMMARY OF THE INVENTION

The first aspect of the present invention discloses a method for wafer analysis on a wafer with a plurality of pattern groups formed thereon. Each of the pattern groups has a plurality of patterns simultaneously defined by one shot in a development manufacturing process, the patterns of the pattern groups comprising defective patterns failing to comply with a testing condition. The method comprises the steps of: defining a plurality of specific distribution maps, wherein each of the specific distribution maps respectively refers to a defect pattern distribution in a pattern group; defining a plurality of distribution features, wherein each of the specific distribution maps is in relation to one of the distribution features; comparing each of the pattern groups on the wafer to each of the specific distribution maps in order to relate each of the pattern groups to at least one of the specific distribution maps; relating each of the pattern groups on the wafer indirectly to at least one of the distribution features while allocating each of the distribution features indirectly related to each of the pattern groups with a respective relative value according to the relation between the specific distribution maps and the distribution features; and summing up the relative values of each of the distribution features on the wafer respectively to obtain total values of the distribution features.

The method according to the first aspect of the present invention may further comprise a step of: determining the relation between the pattern groups and the specific distribution maps by selecting at least one of the specific distribution maps so that the pattern group correlates to a similar group of characteristics on the selected specific distribution maps.

The method according to the first aspect of the present invention may further comprise a step of: obtaining a reference chart of the total values corresponding to the distribution features.

In the method according to the first aspect of the present invention, the relative values of the distribution features in relation to one of the pattern groups may be respectively set to a value of $1/n$ where n of the distribution features are in indirect relation to the pattern group, and the number n is a natural number; and the pattern groups may be respectively formed with the patterns in a matrix of a×b, and a and b are both natural numbers.

The second aspect of the present invention discloses a apparatus for wafer analysis for the wafer as described in the first aspect of the present invention. The apparatus comprises a first database for saving a plurality of specific distribution maps, wherein each of the specific distribution maps respectively refers to a defect pattern distribution in a pattern group; a second database for saving a plurality of distribution features; a third database having a plurality of fields, the fields corresponding to the distribution features in the second database; a fourth database for saving the pattern groups on the wafer; a first relating unit for relating each of the specific distribution maps in the first database respectively to one of the distribution features in the second database; a second relating unit for comparing each of the pattern groups in the fourth database to each of the specific distribution maps in the first database in order to relate each of the pattern groups to at least one of the specific distribution maps; an analyzing unit for relating each of the pattern groups in the fourth database indirectly to at least one of the distribution features in the second database while allocating each of the distribution features indirectly related to each of the pattern groups with a respective relative value according to the relations achieved by the first relating unit and the second relating unit; and a computing unit for respectively summing up the relative values of each of the distribution features in the first database to obtain total values of the distribution features, and saving the total values in the fields of the third database.

In the apparatus according to the second aspect of the present invention, the second relating unit may comprise a pattern map comparing unit for determining the relation between the pattern groups in the fourth database and the specific distribution maps in the first database by selecting at least one of the specific distribution maps so that the pattern group correlates to a similar group of characteristics on the selected specific distribution maps.

The apparatus according to the second aspect of the present invention may further comprise an output unit for outputting the total values of the distribution features according to the fields of the third database. The analyzing unit in the apparatus may be provided in a computer, and the output unit may be a computer display, a printer, or a television.

Further, in the apparatus according to the second aspect of the present invention, the relative values of the distribution features in relation to one of the pattern groups may be respectively set to a value of 1/n where n of the distribution features in indirect relation to the pattern group, and the number n is a natural number; and the pattern groups may be respectively formed with the patterns in a matrix of a×b and a and b are both natural numbers.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The First Embodiment

In the first embodiment of the present invention, the wafer manufacturing process analysis method will be described.

Figure 1:
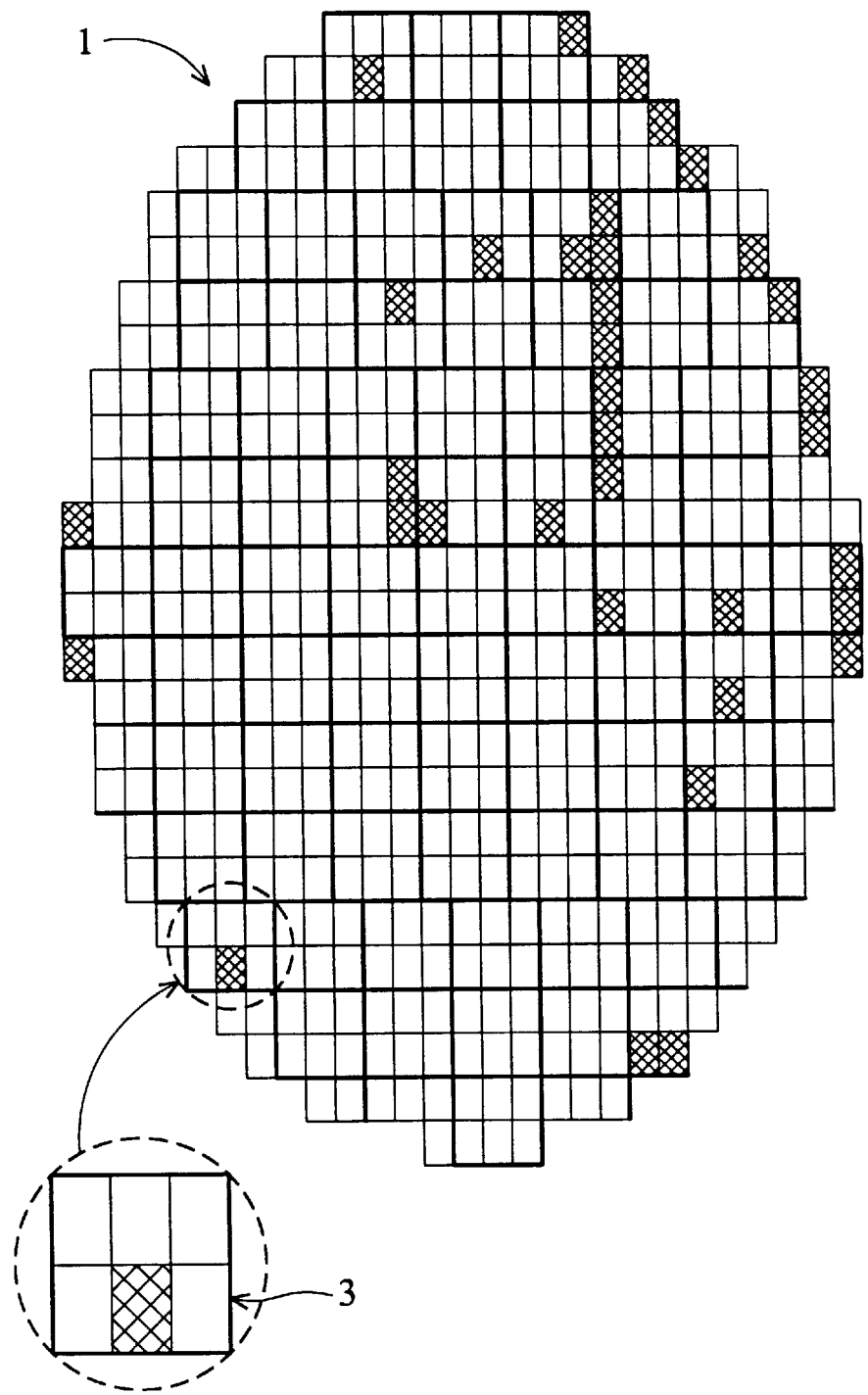
FIG. 1 is a schematic view of a wafer forming a semiconductor device in the prior art.
Figure 2A:
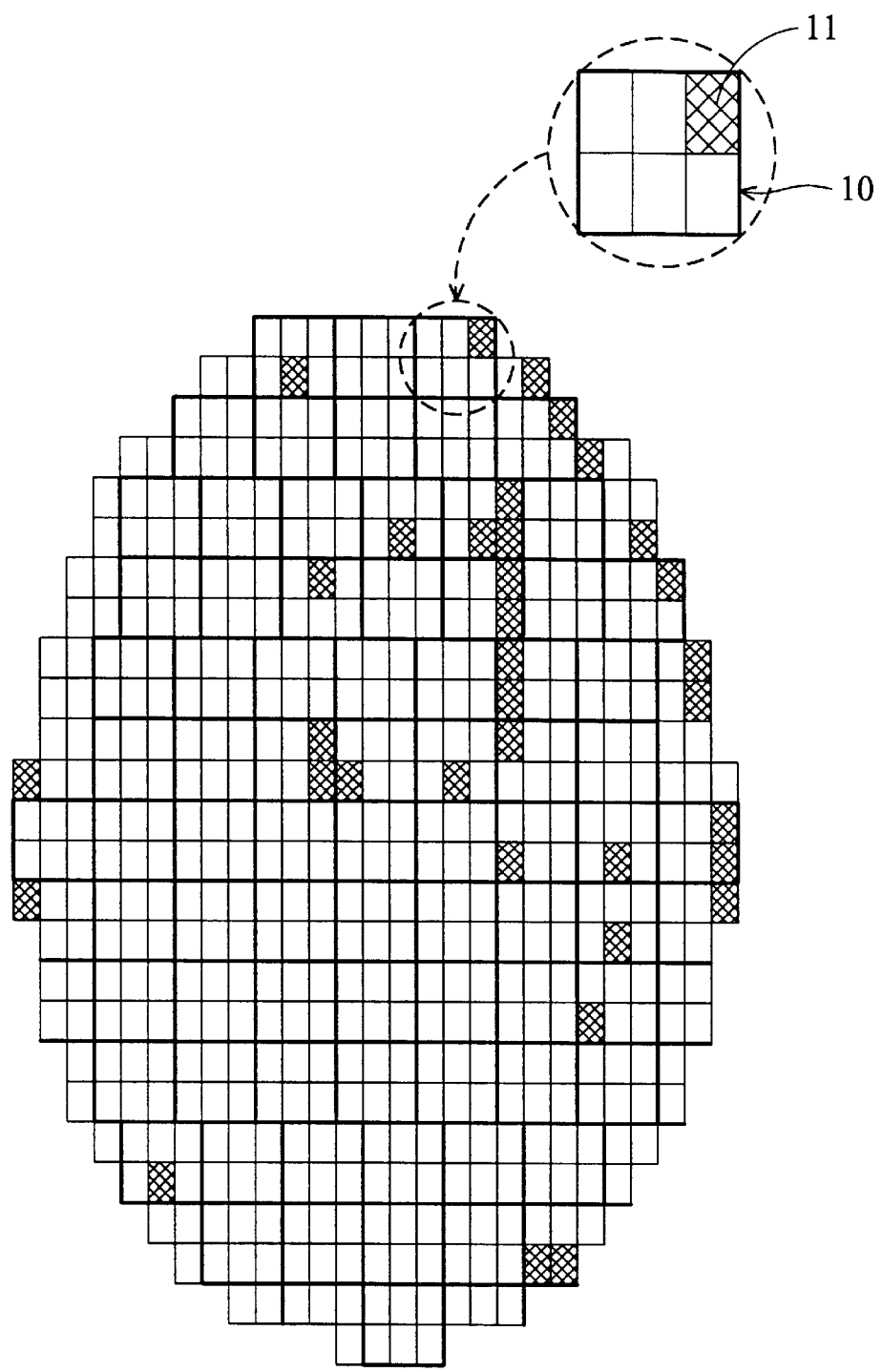
FIG. 2a and FIG. 2b are schematic diagrams showing the specific distribution maps in the method of the invention.

Referring to FIG. 2a, in this embodiment, a wafer 100 with patterns groups 10 in the form of a 2×3 matrix is applied. The method of this embodiment will be hereinafter described, while the order of the steps in the method is not limited to the following sequence.

Figure 2B:
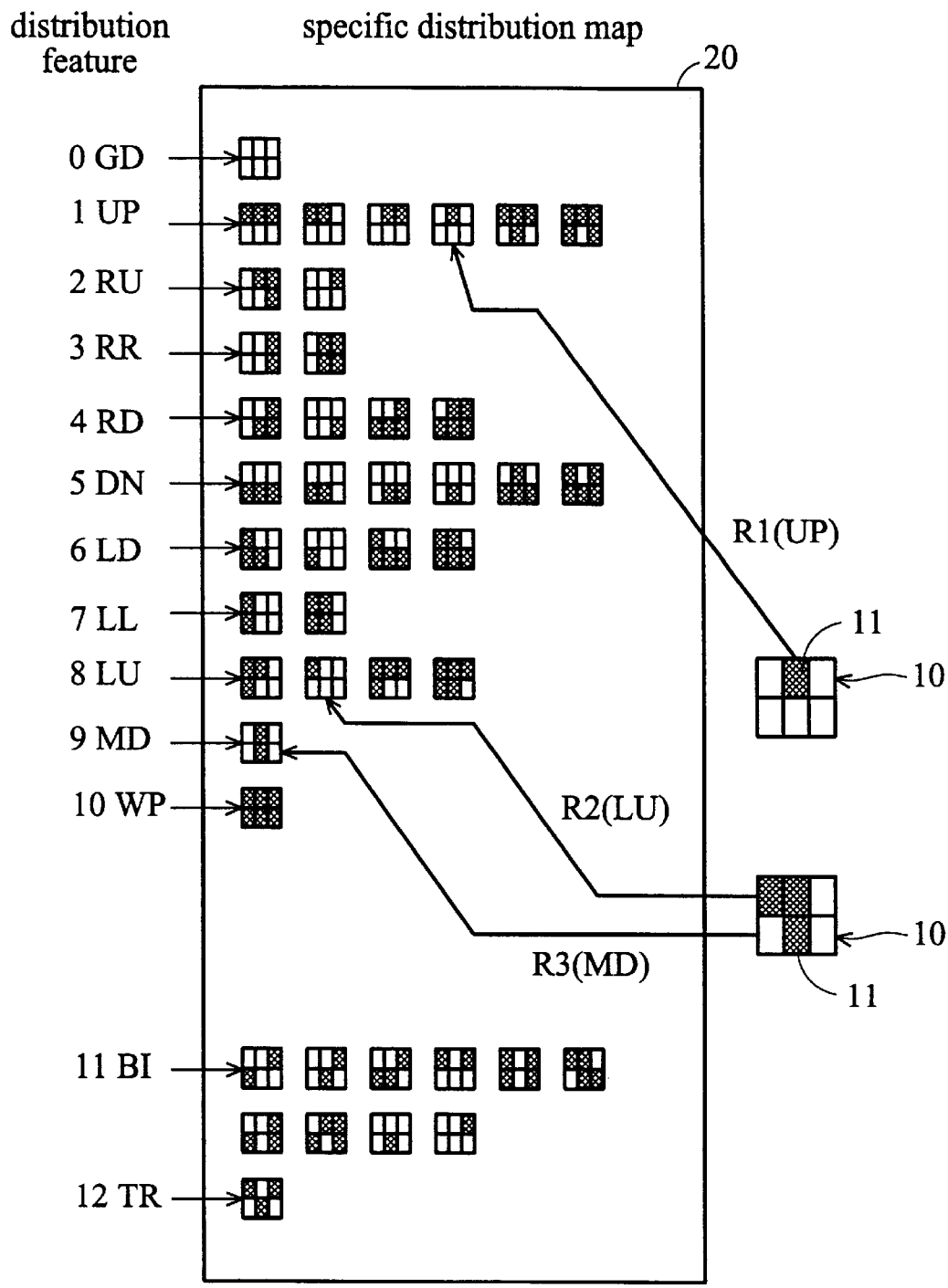

First, a plurality of specific distribution maps is defined as indicated in the reference numeral 20 in FIG. 2b. These specific distribution maps 20 represent possible forms of the defect patterns 11 distributed in a pattern group 10 on the wafer.

Next, a plurality of distribution features is defined. Referring to FIG. 2b, in this embodiment, the distribution features classify the position of the defective patterns 11 distributed in a pattern group 10. These distribution features in such classification are represented by the abbreviations of GD (good dies), UP (upward region defective), RU (right-upward region defective), RR (right region defective), RD (right-downward region defective), DN (downward region defective), LD (left-downward region defective), LL (left region defective), LU (left-upward region defective), MD (middle region defective), WP (whole region with problem), BI (bi-region defective), TR (tripled region defective), each to a case of distribution of the defect pattern 11. Thus, each of the specific distribution maps 20 can be in relation to one of the distribution features as shown in the rightward arrows. For example, in the case of the UP distribution feature, there are six specific distribution maps 20, as shown in FIG. 2b, in relation to the UP feature.

Then, one of the pattern groups 10 is selected, and the selected pattern group 10 is compared to each of the specific distribution maps 20 one by one. If one of the specific distribution maps 20 is the same as the selected pattern group 10, the pattern group 10 is related to the specific distribution map 20, as shown in the case of R1 in FIG. 2b. Some pattern groups 10, however, do not match any one of the specific distribution maps 20; in this case, several specific distribution maps 20 (no more than three in this embodiment) are selected, so that the pattern group 10 is in combination with these selected specific distribution maps 20, as shown in the case of R2 and R3 in FIG. 2b.

Then, according to the relation between the specific distribution maps 20 and the distribution features, it is possible to relate each of the pattern groups 10 on the wafer 100 indirectly to the distribution features. That is, a pattern group 10 may relate to one or more of the distribution features.

In the above indirect relations, each relation can be referred to a relative line, and each relative line is allocated with a respective relative value, such as the denoted numerals R1, R2, R3 as shown in FIG. 2b. The relative value represents the relation between a pattern group and the indirectly related distribution feature. In this embodiment, the relative value of the distribution features in relation to one of the pattern groups is respectively set to a value of 1/n where n of the distribution features in indirect relation to the pattern group, and the number n is a natural number. In FIG. 2b, for example, the relative value R1 is 1, while the relative values R2 and R3 are respectively set to ½ in order to show the two distribution features in relation to the pattern group.

Finally, the relative values of each of the distribution features UP, RU, RR . . . are respectively summed up. Each of the sums of each distribution features, that is, the total value of each distribution feature, refers to the relation of the defective patterns 11 in all the pattern groups 10 on the wafer 100 to the distribution feature.

Figure 3:
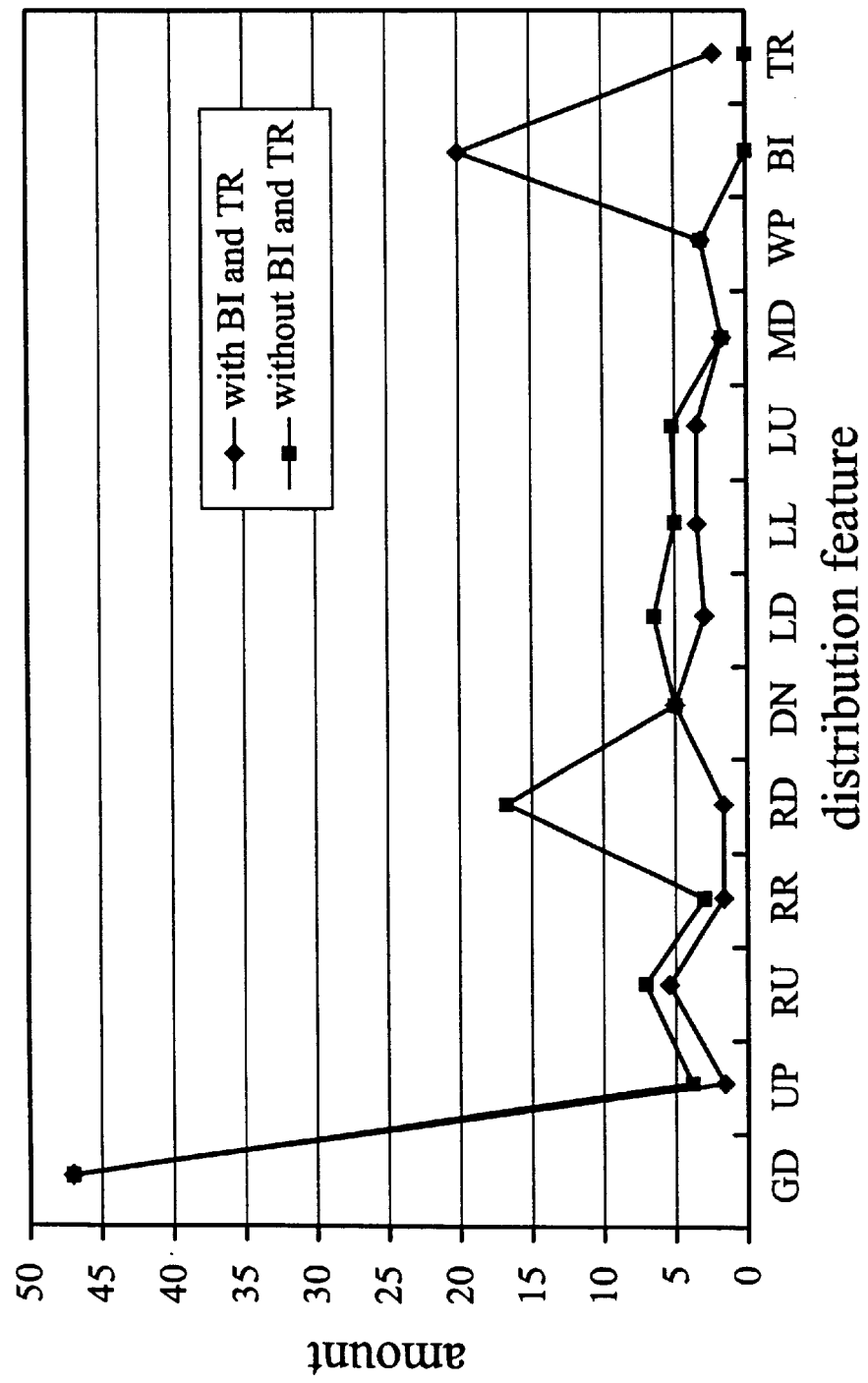
FIG. 3 is a reference chart showing the total values of the specific distribution maps according to the method of the invention.

According to the total values of the distribution features, it is possible to obtain a reference chart of the total values corresponding to the distribution features, as shown in FIG. 3. With the chart, it is easier to comprehend distribution trend of the defective pattern 11 in the pattern groups 10 on the wafer 100. Improvement of the manufacturing process is then easier to carry out.

It should be mentioned that some of the specific distribution maps in this embodiment can be a combination or combinations of other specific distribution maps. For example, each of the specific distribution maps in relation to the distribution features BI or TR can be combined with the specific distribution maps in relation to the distribution features UP, RU, RR, RD, DN, LD, LL, LU or MD. In this case, relations between defective pattern distribution and the distribution features will be of multiple choices, and the distribution features can be selectively chosen in different cases of wafer analysis. For example, in the chart of FIG. 3, the two lines refer to different analyses of a wafer; one where the distribution features comprise BI and TR, and the other is without BI and TR. This can be determined by the needs of the manufacturing process analysis.

The method in this embodiment can be further used for a wafer with the pattern groups thereon respectively formed with the patterns in a matrix of a×b, and a and b are both natural numbers. That is, the matrix is not limited in the above-mentioned 2×3 matrix.

The Second Embodiment

In the second embodiment of the present invention, the wafer manufacturing process analysis apparatus will be described.

Figure 4:
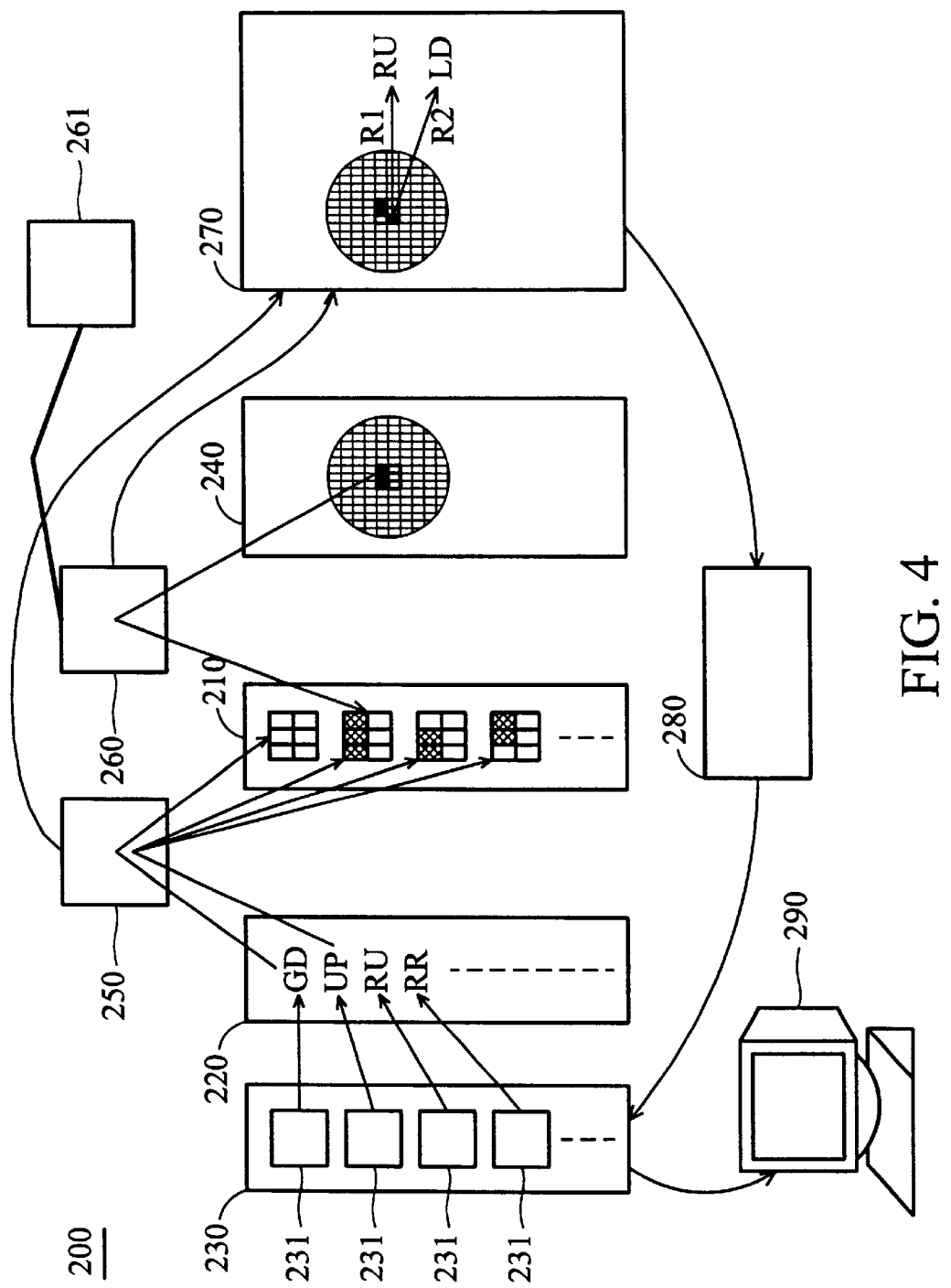
FIG. 4 is a schematic diagram showing the manufacturing process analysis apparatus of the invention.

Referring to FIG. 4, the apparatus of this embodiment is provided in a computer 200. The apparatus comprises: a first database 210 for saving a plurality of specific distribution maps 20 in the first embodiment; a second database 220 for saving a plurality of distribution features in the first embodiment; a third database 230 having a plurality of fields 231, the fields 231 corresponding to the distribution features in the second database 220 in order to save the total values in the first embodiment; a fourth database 240 for saving the pattern groups 10 on the wafer 100; a first relating unit 250 for relating each of the specific distribution maps 20 in the first database 210 respectively to one of the distribution features in the second database 220 as described in the first embodiment; a second relating unit 260 for comparing each of the pattern groups 10 in the fourth database 240 to each of the specific distribution maps 20 in the first database 210, in order to relate each of the pattern groups 10 to at least one of the specific distribution maps 20 as described in the first embodiment; and an analyzing unit 270 for relating each of the pattern groups 10 in the fourth database 240 indirectly to at least one of the distribution features in the second database 220 while allocating each of the distribution features indirectly related to each of the pattern groups 10 with a respective relative value (R1, R2, R3 . . . ) as described in the first embodiment. Similarly, in this embodiment, the relative value of the distribution features in relation to one of the pattern groups 10 is respectively set to a value of 1/n where n of the distribution features in indirect relation to the pattern group 10, and the number n is a natural number.

In addition, the apparatus of this embodiment further comprises a computing unit 280 for respectively summing up the relative values of each of the distribution features in the first database 210 to obtain total values of the distribution features, and saving the total values in the fields 231 of the third database 230.

In the apparatus of this embodiment, the second relating unit 260 has a pattern map comparing unit 261, such as an image analyzing program, for selecting one or more of the specific distribution maps 20 in the first database 210, to determine the relation between the pattern groups 10 in the fourth database 240 and these selected specific distribution maps, so that the pattern group can be in combination of the selected specific distribution maps.

In the apparatus of this embodiment, an output unit 290 is further provided for outputting the total values of the distribution features according to the fields 231 of the third database 230. The output unit 290 can be a computer display, a printer, or a television.

Similarly, the apparatus of this embodiment can be further used for a wafer with the pattern groups thereon respectively formed with the patterns in a matrix of a×b, and a and b are both natural numbers. That is, the matrix is not limited in the above-mentioned 2×3 matrix.

With the method and apparatus disclosed in the present invention, it is easier to analyze defective patterns on the wafer systematically and effectively.

While the present invention has been described with reference to the preferred embodiments thereof, it is to be understood that the invention is not limited to the described embodiments or constructions. On the contrary, the invention is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for wafer analysis, comprising the steps of:
   providing a wafer with a plurality of pattern groups formed thereon, each of the pattern groups having a plurality of patterns simultaneously defined by one shot in a development manufacturing process, the patterns of the pattern groups including defective patterns failing to comply with a testing condition;
   defining a plurality of specific distribution maps, wherein each of the specific distribution maps respectively refers to a defect pattern distribution in a pattern group;
   defining a plurality of distribution features, wherein each of the specific distribution maps are related to one of the distribution features; comparing each of the pattern groups on the wafer to each of the specific distribution maps in order to relate each of the pattern groups to at least one of the specific distribution maps;
   relating each of the pattern groups on the wafer indirectly to at least one of the distribution features while allocating each of the distribution features indirectly related to each of the pattern groups with a respective value according to the relation between the specific distribution maps and the distribution features;
   summing up the values associated with each of the distribution features on the wafer respectively to obtain total values of the distribution features; and
   determining the defective patterns from the total values of the distribution features.

2. The method according claim 1 further comprising a step of:
   correlating each of the pattern groups with distribution map if the defective patterns in the pattern group are arranged in the same manner as the specific distribution map.

3. The method according to claim 1 further comprising a step of:
   obtaining a reference chart of the total values corresponding to the distribution features.

4. The method according claim 1, wherein the value associated with each of the distribution features is respectively set to (1/n), where n is the number of distribution features that are indirectly related to pattern group, and the number n is a natural number.

5. The method according to claim 1, wherein the pattern groups are respectively formed with the patterns in a matrix of a×b, and a and b are both natural numbers.

6. A wafer analysis apparatus, comprising:
   a wafer with a plurality of pattern groups formed thereon, each of the pattern groups having a plurality of patterns simultaneously defined by one shot in a development manufacturing process, the patterns of the pattern groups including defective patterns failing to comply with a testing condition;
   a first database for saving a plurality of specific distribution maps, wherein each of the specific distribution maps respectively refers to a defect pattern distribution in a pattern group;
   a second database for saving a plurality of distribution features; a third database having a plurality of fields, the fields corresponding to the distribution features in the second database;
   a fourth database for saving the pattern groups on the wafer; a first relating unit for relating each of the specific distribution maps in the first database respectively to one of the distribution features in the second database;
   a second relating unit for comparing each of the pattern groups in the fourth database to each of the specific distribution maps in the first database in order to relate each of the pattern groups to at least one of the specific distribution maps;

an analyzing unit for relating each of the pattern groups in the fourth database indirectly to at least one of the distribution features in the second database while allocating each of the distribution features indirectly related to each of the pattern groups with a respective value according to the relations achieved by the first relating unit and the second relating unit; and a computing unit for respectively summing up the values associated with each of the distribution features in the first database to obtain total values of the distribution features, and saving the total values in the fields of the third database.

7. The apparatus according to claim 6, wherein the second relating unit comprises a pattern map comparing unit for determining the relation between the pattern groups in the fourth database and the specific distribution maps in the first database by selecting at least one of the specific distribution maps so that the pattern group correlates to a similar group of characteristics on the selected specific distribution maps.

8. The apparatus according to claim 7, further comprising an output unit for outputting the total values of the distribution features according to the fields of the third database.

9. The apparatus according to claim 8, wherein the analyzing unit is provided in a computer.

10. The apparatus according to claim 9, wherein the output unit is a computer display, a printer, or a television.

11. The apparatus according to claim 6, wherein the value associated with each of the distribution features is respectively set to $(1/n)$, where n is the number of distribution features that are indirectly related to the pattern group, and the number n is a natural number.

12. The apparatus according to claim 6, wherein the pattern groups are respectively formed with the patterns in a matrix of a×b, and a and b are both natural numbers.

* * * * *